(12) United States Patent
Hsu et al.

(10) Patent No.: US 9,536,746 B2
(45) Date of Patent: Jan. 3, 2017

(54) RECESS AND EPITAXIAL LAYER TO IMPROVE TRANSISTOR PERFORMANCE

(71) Applicant: Taiwan Semiconductor Manufacturing Co., Ltd., Hsin-Chu (TW)

(72) Inventors: Yeh Hsu, Guishan Township (TW); Chia-Wen Liu, Taipei (TW); Tsung-Hsing Yu, Taipei (TW); Ken-Ichi Goto, Hsin-Chu (TW); Shih-Syuan Huang, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 81 days.

(21) Appl. No.: 14/208,438

(22) Filed: Mar. 13, 2014

(65) Prior Publication Data

US 2015/0263171 A1    Sep. 17, 2015

(51) Int. Cl.
| | | |
|---|---|---|
| H01L 29/78 | (2006.01) | |
| H01L 21/306 | (2006.01) | |
| H01L 21/28 | (2006.01) | |
| H01L 29/66 | (2006.01) | |
| H01L 29/10 | (2006.01) | |
| H01L 21/3065 | (2006.01) | |
| H01L 29/165 | (2006.01) | |

(52) U.S. Cl.
CPC ... *H01L 21/30604* (2013.01); *H01L 21/28123* (2013.01); *H01L 21/3065* (2013.01); *H01L 29/1037* (2013.01); *H01L 29/1054* (2013.01); *H01L 29/66651* (2013.01); *H01L 29/165* (2013.01)

(58) Field of Classification Search
CPC .......... H01L 21/28123; H01L 21/1054; H01L 29/785; H01L 29/7855; H01L 29/7849; H01L 29/66651; H01L 29/1037; H01L 29/1054
USPC ......................................................... 438/424
See application file for complete search history.

(56) References Cited

U.S. PATENT DOCUMENTS 6,417,555 B1 * 7/2002 Ueno ................ H01L 21/76224
                                                257/505
7,145,166 B2 * 12/2006 Lee ..................... H01L 29/1054
                                                257/18

(Continued)

*Primary Examiner* — Mark Prenty
(74) *Attorney, Agent, or Firm* — Eschweiler & Associates, LLC

(57) ABSTRACT

Some embodiments of the present disclosure relate to a semiconductor device configured to mitigate against parasitic coupling while maintaining threshold voltage control for comparatively narrow transistors. In some embodiments, a semiconductor device formed on a semiconductor substrate. The semiconductor device comprises a channel comprising an epitaxial layer that forms an outgrowth above the surface of the semiconductor substrate, and a gate material formed over the epitaxial layer. In some embodiments, a method of forming a semiconductor device is disclosed. The method comprises etching the surface of a semiconductor substrate to form a recess between first and second isolation structures, forming an epitaxial layer within the recess that forms an outgrowth above the surface of the semiconductor substrate, and forming a gate material over the epitaxial layer. Other embodiments are also disclosed.

20 Claims, 8 Drawing Sheets

(56) References Cited

U.S. PATENT DOCUMENTS

| | | | |
|---|---|---|---|
| 7,247,534 B2* | 7/2007 | Chidambarrao | H01L 29/1054 257/18 |
| 8,350,343 B2* | 1/2013 | Anderson | H01L 21/82380 257/372 |
| 8,748,275 B2* | 6/2014 | Thees | H01L 21/76232 257/E21.218 |
| 2003/0162348 A1* | 8/2003 | Yeo | H01L 29/1054 438/218 |
| 2004/0004257 A1* | 1/2004 | Lee | H01L 28/60 257/390 |
| 2005/0051795 A1* | 3/2005 | Arena | C30B 25/02 257/183 |
| 2009/0142892 A1* | 6/2009 | Lee | H01L 29/1054 438/218 |
| 2012/0235245 A1* | 9/2012 | Pal | H01L 21/82348 257/368 |
| 2012/0299157 A1* | 11/2012 | Hsuan | H01L 21/28123 257/618 |
| 2013/0210216 A1* | 8/2013 | Kronholz | H01L 29/1054 438/478 |
| 2014/0065808 A1* | 3/2014 | Grass | H01L 21/02164 438/585 |
| 2015/0263096 A1* | 9/2015 | Yu | H01L 29/165 257/77 |

* cited by examiner

RECESS AND EPITAXIAL LAYER TO IMPROVE TRANSISTOR PERFORMANCE

BACKGROUND

A modern integrated circuit (IC) manufactured on a semiconductor substrate contains millions or even billions of semiconductor devices. To accommodate even more semiconductor devices such as transistors within a fixed area of a substrate, the size of the semiconductor devices continues to scale between successive technology nodes according to Moore's Law. One consequence of this scaling is a reduction in the effective channel width of transistors, which can change their threshold voltage in an unpredictable manner. Another consequence is an increase in parasitic coupling between the semiconductor devices within the IC. These consequences can degrade performance and reduce yield of the IC.

DETAILED DESCRIPTION

Figure 1:
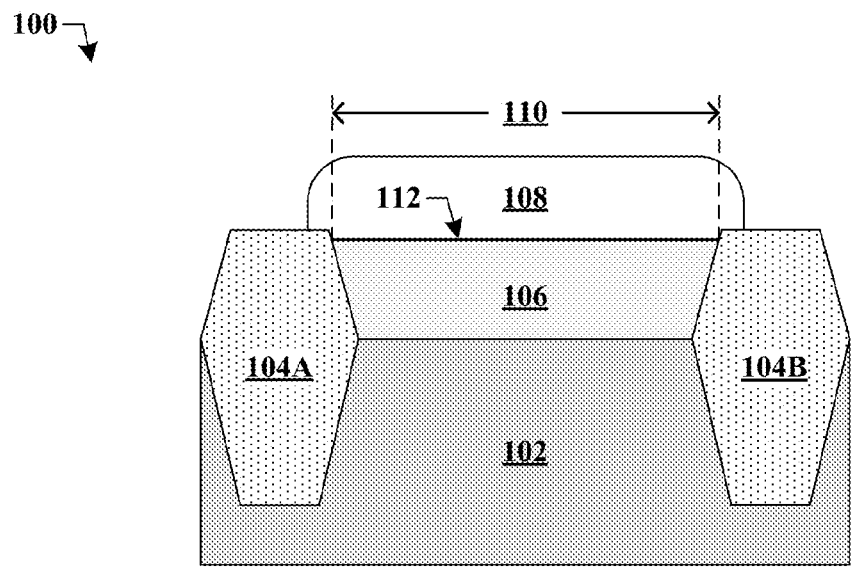
FIG. 1 illustrates a cross-sectional view of a semiconductor device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor scaling results in an increase in parasitic coupling between devices of a manufactured integrated circuit (IC), which can reduce device speeds and hence performance of the IC. Additionally, in advanced technology nodes (e.g., the 65 nm node and beyond), the threshold voltage of comparatively narrow transistors within the IC becomes difficult to control due to mechanisms like the short-channel effect (SCE), narrow width effect (NWE), inverse narrow width effect (INWE), drain-induced barrier-lowering (DIBL), etc.

Accordingly, some embodiments of the present disclosure relate to a semiconductor device configured to mitigate against parasitic coupling while maintaining threshold voltage control for comparatively narrow transistors. In some embodiments, a semiconductor device is formed on a semiconductor substrate. The semiconductor device comprises a channel comprising an epitaxial layer that forms an outgrowth above the surface of the semiconductor substrate, and a gate material formed over the epitaxial layer. In some embodiments, a method of forming a semiconductor device is disclosed. The method comprises etching the surface of a semiconductor substrate to form a recess between first and second isolation structures (e.g., STIs), forming an epitaxial layer within the recess that forms an outgrowth above the surface of the semiconductor substrate, and forming a gate material over the epitaxial layer. Other embodiments are also disclosed.

FIG. 1 illustrates a cross-sectional view of a semiconductor device 100 associated with some conventional approaches. The semiconductor device 100 is formed on a semiconductor substrate 102 and includes a channel 106 formed between first and second isolation structures 104A, 104B. The semiconductor device 100 also includes a gate structure 108 (e.g., comprising polysilicon) formed over the channel 106. An effective channel width 110 for the semiconductor device 100 is defined by the intersection 112 of a bottom surface of the gate structure 108 and a top surface of the channel 106.

Figure 2:
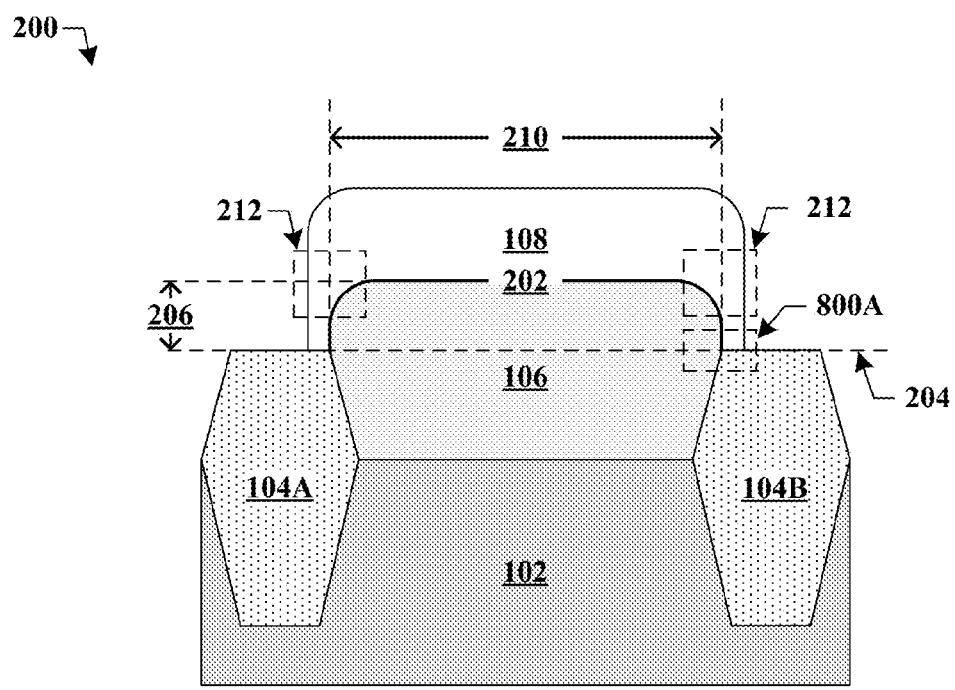
FIG. 2 illustrates a cross-sectional view of some embodiments of a semiconductor device comprising a channel formed within an epitaxial layer, which forms an outgrowth.

FIG. 2 illustrates a cross-sectional view of some embodiments of a semiconductor device 200 comprising a gate structure 108 and a channel 106 formed between first and second isolation structures 104A, 104B on a semiconductor substrate 102. The channel 106 includes one or more epitaxial layers formed within a recess between the first and second isolation structures 104A, 104B. The channel 106 forms an outgrowth 202 that extends above a surface 204 of the semiconductor substrate 102 by a height 206. Despite occupying the same amount of substrate area and having the same space between the first and second isolation structures 104A, 104B, the semiconductor device 200 has an effective channel width that is greater than the effective channel width 110 for the semiconductor device 100 due to the outgrowth 202 of the channel 106.

In particular, the effective channel width of the semiconductor device 200 is about equal to a width 210 of the channel 106 between top surfaces of the first and second isolation structures 104A, 104B plus twice the height 206 of the outgrowth 202. This is an increase in effective channel width of the semiconductor device 200 by a value about equal to twice the height 206 of the outgrowth 202 over the effective channel width 110 for the semiconductor device 100. However, this value is not exact because of rounding of the top surface of the outgrowth 202 in edge regions 212. The increased effective channel width of the semiconductor device 200 achieves a higher drive current through the channel 106 of the semiconductor device 200 compared to semiconductor device 100.

Figure 3:
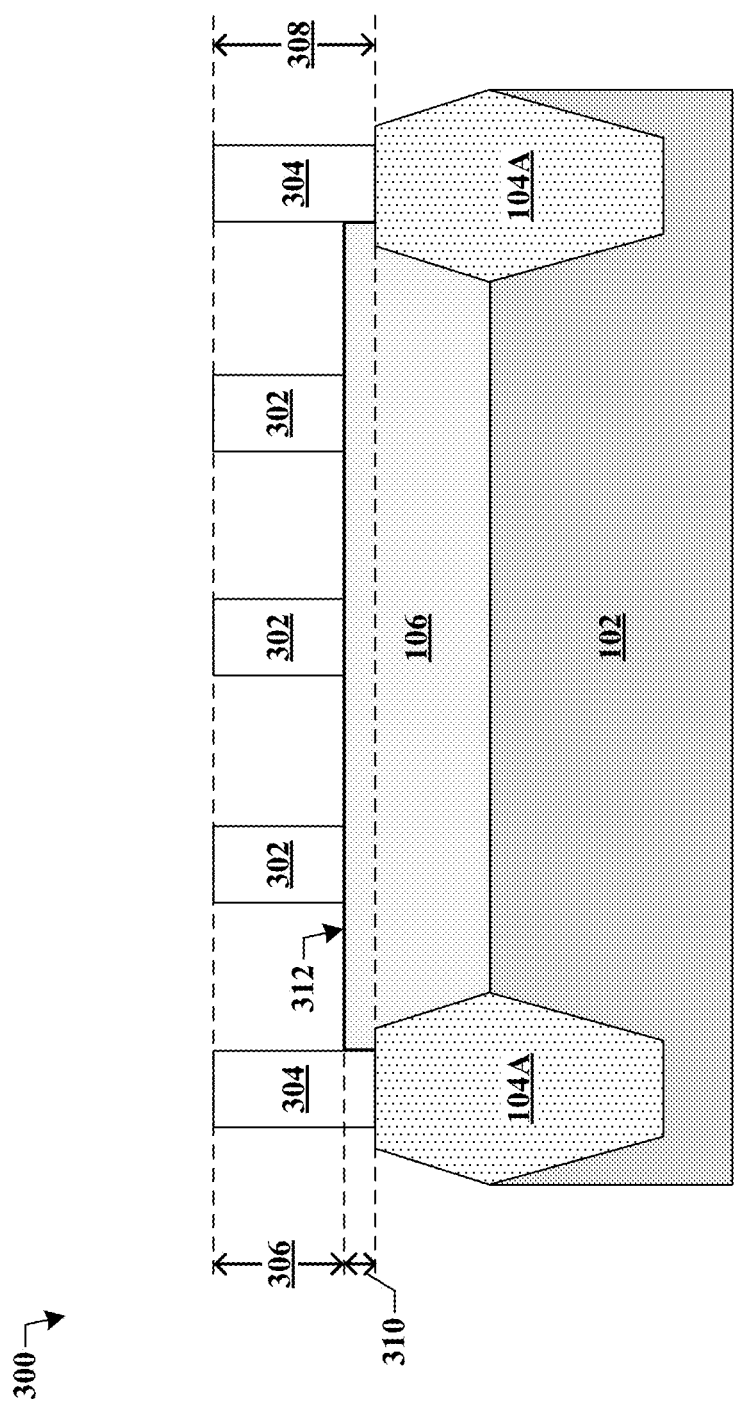
FIG. 3 illustrates a cross-sectional view of some embodiments of a semiconductor device comprising first gate structures formed over a channel of the semiconductor device and second gate structures formed over first or second isolation structures laterally formed on either side of the channel.

FIG. 3 illustrates a cross-sectional view of some embodiments of a semiconductor device 300 comprising first gate structures 302 with a first height 306 formed over a channel 106 and second gate structures 304 with a second height 308 formed over first or second isolation structures 104A, 104B, which are laterally formed on either side of the channel 106. For the embodiments of FIG. 3, the second gate structures 304 are taller than the first gate structures 302 by a difference that is about equal to a third height 310 of the outgrowth 312 of the channel 106.

Some conventional versions of the semiconductor device 300 use first gate and second gate structures 302, 304 which both have the second height 308. The smaller gate height of the first gate structures 302 relative to conventional versions of semiconductor device 300 reduces capacitive coupling between the first and second gate structures 302, 304. The circuit speed of the semiconductor device 300 is proportional to I/CV, where I is the drive current, C is the parasitic capacitance, and V is the operation voltage. Therefore, the decreased parasitic capacitance improves the circuit speed. Moreover, the decreased parasitic capacitance in conjunction with a higher drive current resulting from the outgrowth 312 of the channel 106 further increases the circuit speed of the semiconductor device 300 over the reduced capacitive coupling alone.

In some embodiments, the third height 310 is in a range of about 2 nm to about 10 nm, which decreases the gate capacitance of the first and second gate structures 302, 304 by about 4% over a height 206 of zero (i.e., where the first height 306 is about equal to the second height 308). In some embodiments, this reduction in gate capacitance can improve the circuit speed of the semiconductor device 300 by about 3% to about 5%.

Figure 4A:
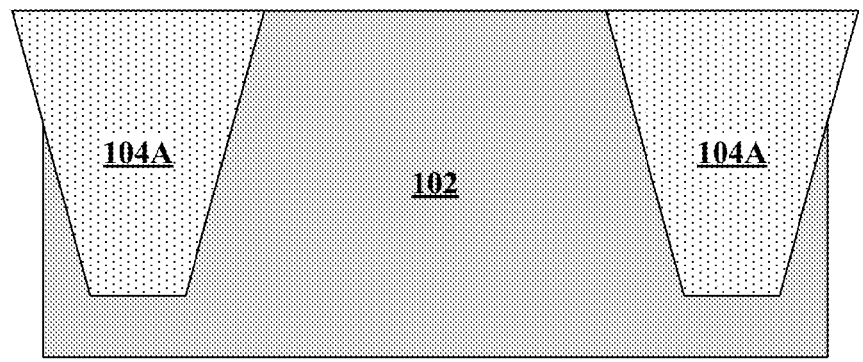
FIGS. 4A-4D illustrate cross-sectional views of some embodiments of forming a semiconductor device by etching a semiconductor substrate to form a recess, which is then filled with an epitaxial layer that forms an outgrowth that extends above the surface of the semiconductor substrate.

FIGS. 4A-4D illustrate cross-sectional views of some embodiments of forming a semiconductor device. FIG. 4A illustrates a cross-sectional view of some embodiments of a semiconductor substrate 102, where first and second isolation structures 104A, 104B are formed. Formation of the first and second isolation structures 104A, 104B includes etching the semiconductor substrate 102 to form trenches, which are subsequently filled with a dielectric material (e.g., $SiO_2$). In some embodiments, the first and second isolation structures 104A, 104B comprise shallow trench isolation (STI) structures configured to electrically isolate a semiconductor device formed in subsequent steps from other areas of the semiconductor substrate 102. In some embodiments, the semiconductor substrate 102 is a silicon substrate. Alternatively, the semiconductor substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the semiconductor substrate 102 is a semiconductor on insulator (SOI).

Figure 4B:
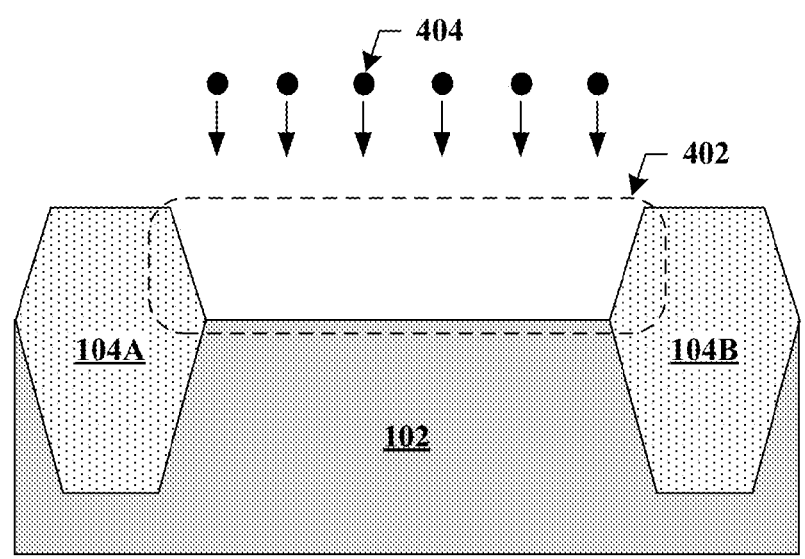

FIG. 4B illustrates a cross-sectional view of some embodiments of a semiconductor device 400B, comprising the semiconductor substrate 102 of FIG. 4A, where etching the semiconductor substrate 102 is performed to form a recess 402 within a channel region of the semiconductor substrate 102. In some embodiments, the etch comprises one or more etchant types 404 and occurs in one or more steps.

Figure 4C:
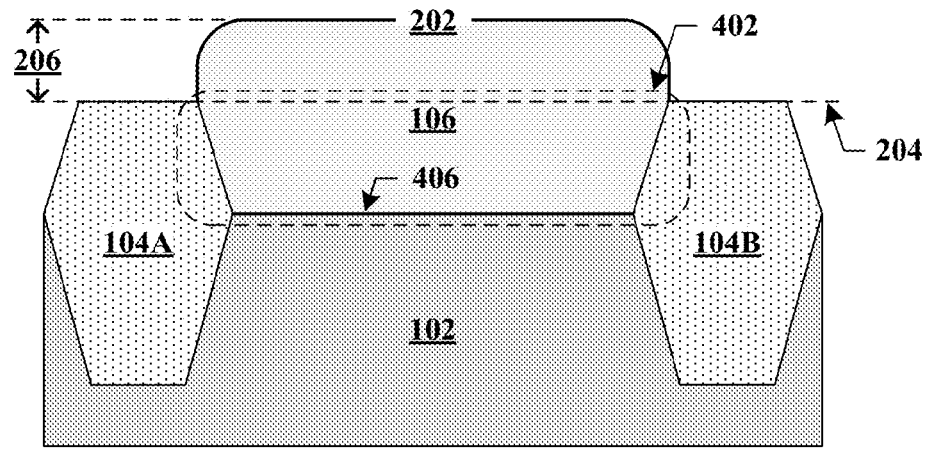
Figure 6:
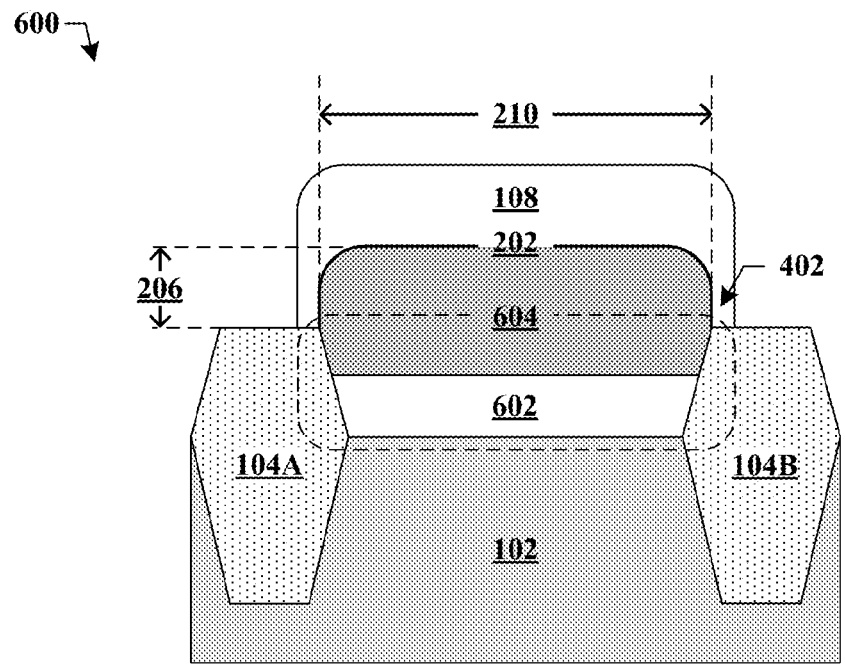
FIG. 6 illustrates a cross-sectional view of some embodiments of a semiconductor device of the present disclosure with a substrate material layer formed over the epitaxial layer.
Figure 7:
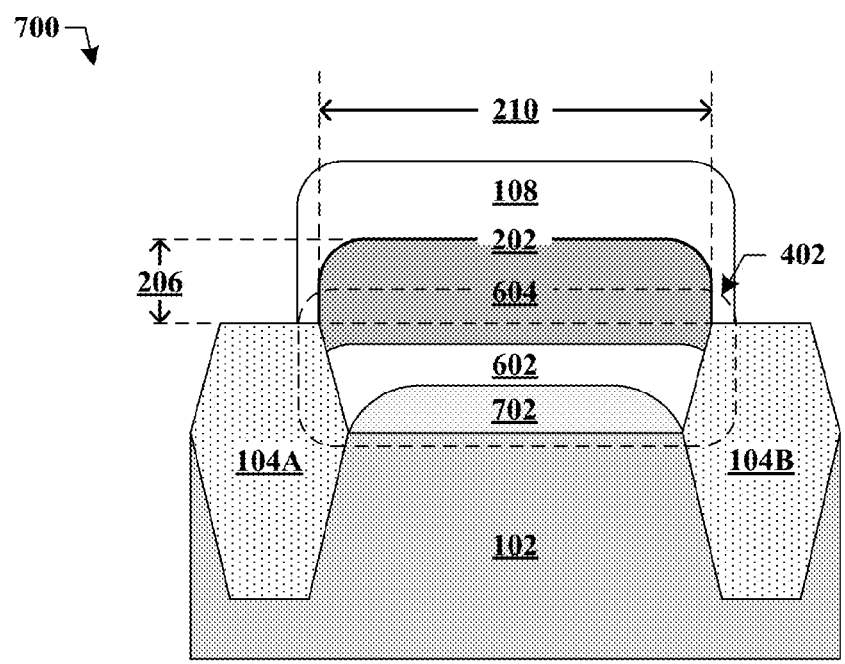
FIG. 7 illustrates a cross-sectional view of some embodiments of a semiconductor device of the present disclosure with a strain-relaxing formed layer below the epitaxial layer.

FIG. 4C illustrates a cross-sectional view of some embodiments of a semiconductor device 400C, comprising the semiconductor device 400B, where a channel 106 is formed over the bottom surface 406 of the recess 402. The channel 106 includes an outgrowth 202 that extends above the surface 204 of the semiconductor substrate 102 by a height 206. In some embodiments, the channel 106 comprises one or more layers. Some of these embodiments are illustrated in FIGS. 6-7. In various embodiments, the channel 106 includes silicon (Si) or other substrate material, a carbon-containing material such as silicon carbide (SiC), germanium-tin (GeSn), silicon-germanium (SiGe), or silicon-germanium-carbide (SiGeC), or combinations thereof. In some embodiments, the thickness of the channel 106 is optimized to meet performance requirements of the semiconductor device 400C.

Figure 4D:
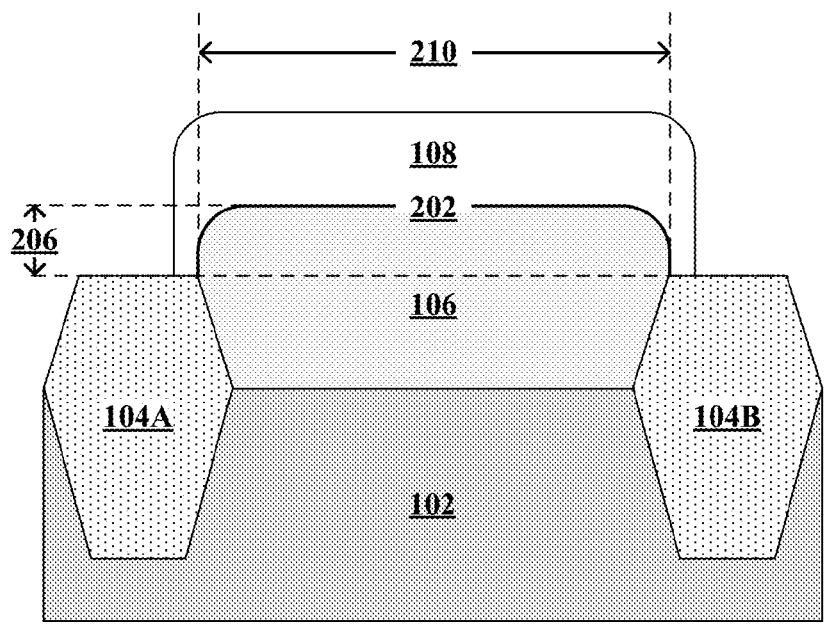

FIG. 4D illustrates a cross-sectional view of some embodiments of a semiconductor device 400D, comprising the semiconductor device 400C, wherein a gate structure 108 is formed over the channel 106. The resulting semiconductor device 400D comprises an effective channel width that is about equal to a width 210 of the channel 106 between top surfaces of the first and second isolation structures 104A, 104B plus twice the height 206 of the outgrowth 202. The outgrowth 202 thus increases the effective channel width of the semiconductor device 400D by approximately twice the height 206 of the outgrowth 202 over a planar interface between the channel 106 and the gate structure 108 (i.e., an outgrowth height 206 of zero).

Figure 5A:
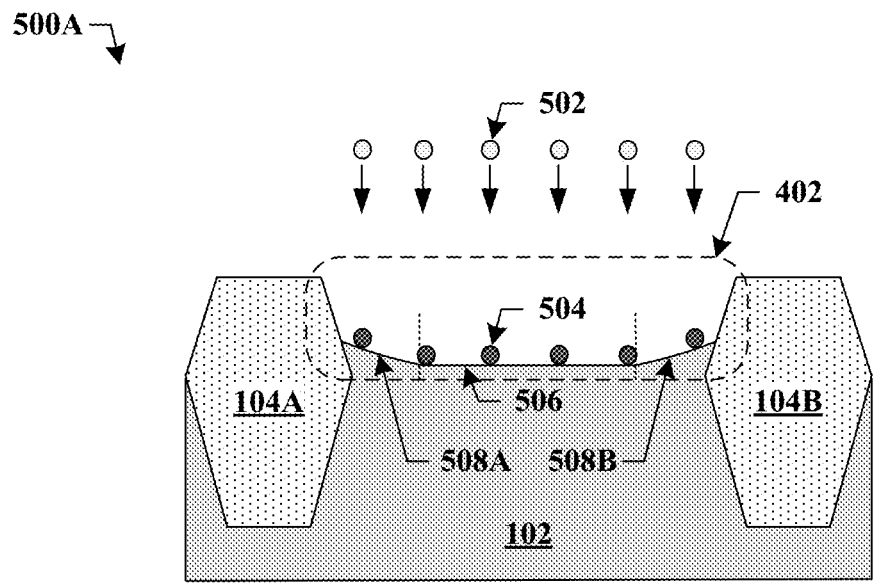
FIGS. 5A-5B illustrate some embodiments of forming a recess within a semiconductor substrate by bombarding the surface of the semiconductor substrate with ions while simultaneously exposing the top surface to a chemical solvent, then subsequently exposing a bottom surface of the recess to a chemical vapor.
Figure 5B:
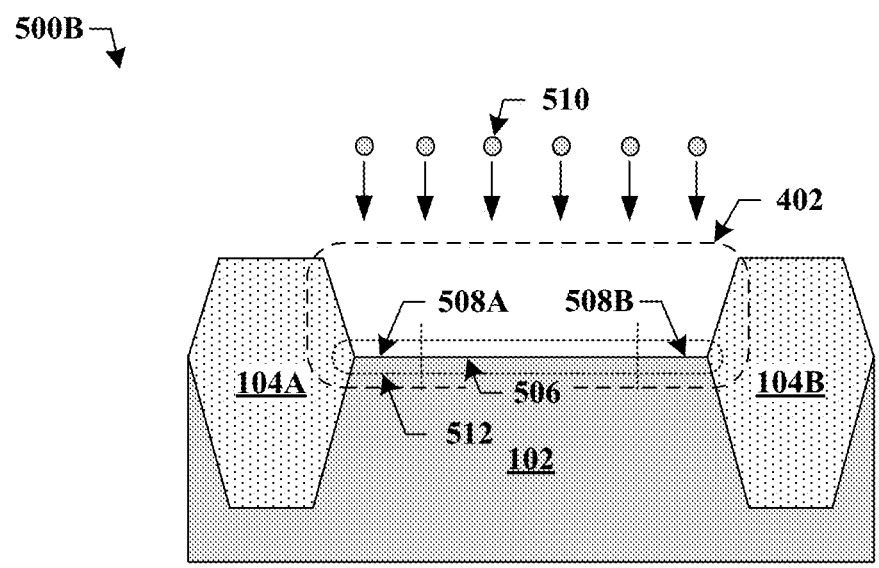

FIGS. 5A-5B illustrate some embodiments of forming a recess 402 within the semiconductor substrate 102 of FIG. 4A by simultaneously bombarding the surface with ions and exposing the surface to a chemical solvent, then subsequently exposing a bottom surface of the recess to a chemical vapor. FIG. 5A illustrates a cross-sectional view of some embodiments of a semiconductor device 500A, comprising the semiconductor substrate 102 of FIG. 4A, where a top surface of the semiconductor substrate 102 is bombarded with ions 502, while the top surface is simultaneously exposed to a chemical solvent 504.

In some embodiments, the ion bombardment (502) includes accelerating a plasma of oxygen or fluorine containing gas such as carbon tetrafluoride ($CF_4$) or oxygen ($O_2$) in a potential of greater than about 100 V. Where the potential is created between two electrodes in situ such that the ions 502 are accelerated towards the top surface of the semiconductor substrate 102. The incident ions 502 collide with the top surface with an energy that is greater than a binding energy of the constituent atoms of the semiconductor substrate 102 (e.g., Si atoms). As a result, the atoms are ejected, and a recess 402 is created.

In some embodiments, the chemical solvent 504 includes carbon tetrafluoride ($CF_4$), nitric acid ($HNO_3$), hydrofluoric acid (HF), potassium hydroxide (KOH), ethylenediamine pyrocatechol (EDP), tetramethylammonium hydroxide (TMAH), or a combination thereof. The simultaneously ion bombardment and chemical solvent exposure planarizes a center region 506 of a bottom surface of the recess, and produces a non-planar surface in first and second edge regions 508A, 508B of the bottom surface adjacent the first and second isolation structures 104A, 104B.

FIG. 5B illustrates a cross-sectional view of some embodiments of a semiconductor device 500B, comprising the semiconductor device 500A, where a bottom surface of the recess 410 is exposed to a chemical vapor 510 after the simultaneous ion bombardment and chemical solvent exposure of the embodiments of FIG. 5A. The chemical vapor 510 diffuses along the bottom surface of the recess 410 and reacts with substrate material in the first and second edge regions 508A, 508B at a boundary between the recess 410 and first and second isolation structures 104A, 104B. As a result, the second etch planarizes the first and second edge regions 508A, 508B and creates a planar bottom surface 512 of the recess 410 between the first and second isolation structures 104A, 104B. In some embodiments, the chemical vapor 510 includes $CF_4$, $HNO_3$, HF, KOH, EDP, TMAH, or a combination thereof.

FIG. 6 illustrates a cross-sectional view of some embodiments of a semiconductor device 600 of the present disclosure. The semiconductor device 600 comprises a semiconductor substrate 102 whereupon a recess 402 is formed between first and second isolation structures 104A, 104B. For the embodiments of FIG. 6, a first epitaxial layer 602 is formed within the recess 402, and a second epitaxial layer 604 is formed above the first epitaxial layer 602. In some embodiments, the thickness of the second epitaxial layer 604 is in a range of about 5 nm-to about 30 nm, and the thickness of the first epitaxial layer 602 is in a range of about 2 nm-to about 15 nm. The combined first and second epitaxial layers 602, 604 form a channel (e.g., channel 106 of FIG. 2) comprising an outgrowth 202 of height 206. A gate structure 108 is formed over the second epitaxial layer 604. The semiconductor device 600 further comprises an effective channel width that is about equal to a width 210 of the channel 106 between top surfaces of the first and second isolation structures 104A, 104B plus twice the height 206 of the outgrowth 202.

In some embodiments, the first epitaxial layer 602 comprises a carbon-containing material such as silicon carbide (SiC), germanium-tin (GeSn), silicon-germanium (SiGe), or silicon-germanium-carbide (SiGeC), or combinations thereof. In some embodiments, the second epitaxial layer 604 comprises substrate material.

For the embodiments of FIG. 6, the first epitaxial layer 602 retards dopant back diffusion into the second epitaxial layer 604, resulting in a dopant concentration that is less than 1e18 $cm^{-3}$ at an interface between the second epitaxial layer 604 and the gate structure 108. This relatively low surface dopant concentration provides a steep retrograde doping profile within a channel formed by the first and second epitaxial layers 602, 604, which improves performance of the semiconductor device 600 by mitigating local and global dopant variations within the channel resulting from various subsequent implant steps.

FIG. 7 illustrates a cross-sectional view of some embodiments of a semiconductor device 700 of the present disclosure. The semiconductor device 700 comprises structures that are substantially identical to those of semiconductor device 600 with the addition of a strain-relaxing layer 702 formed between the first epitaxial layer 602 and bottom surface of the recess 402. The strain-relaxing layer 702 is configured to reduce lattice distortions in the first epitaxial layer 602 (and subsequently the second epitaxial layer 604) induced by lattice constant mismatch between the first epitaxial layer 602 and the semiconductor substrate 102. The lattice distortions in the first epitaxial layer 602 can degrade carrier movement within a channel formed from the first and second epitaxial layers 602, 604 (i.e., electron or hole movement). In some embodiments, the strain-relaxing layer 702 includes a substrate material (i.e., the same material used in the semiconductor substrate 102).

Figure 8A:
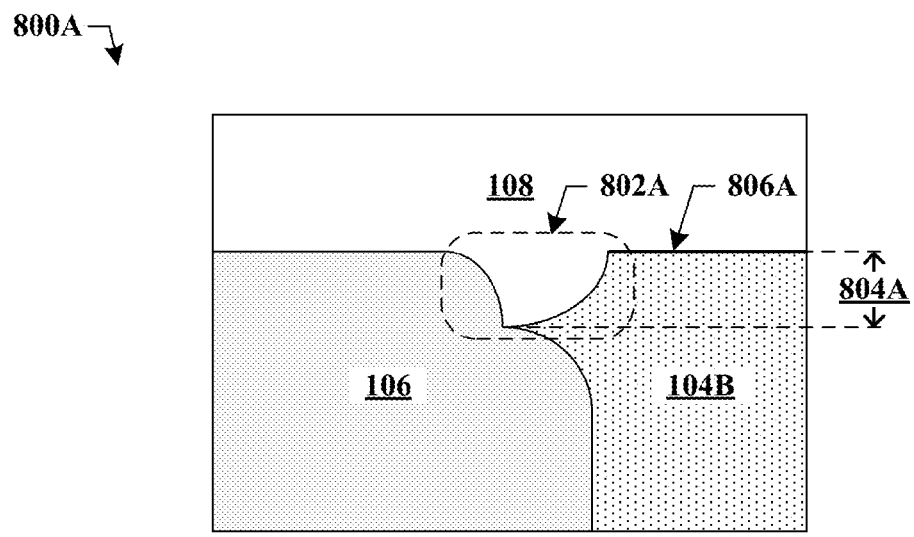
FIGS. 8A-8B illustrate some embodiments of a semiconductor device of the present disclosure with a divot formed in the first or second isolation structure at an interface to the channel.

FIG. 8A Illustrates a cross-sectional view of an interface region 800A between the channel 106, second isolation structure 104B, and gate structure 108 of the semiconductor device 200. The location of the interface region 800A can be seen in the semiconductor device 200 of FIG. 2A. Within the interface region 800A, divot 802A formed in an upper portion of the second isolation structure 104B at an interface to the channel 106 near a top surface 806A of the second isolation structure 104B. The divot 802A is filled with gate material (e.g., polysilicon). In some embodiments, the divot has a depth 804A of less than about 10 nm.

Figure 8B:
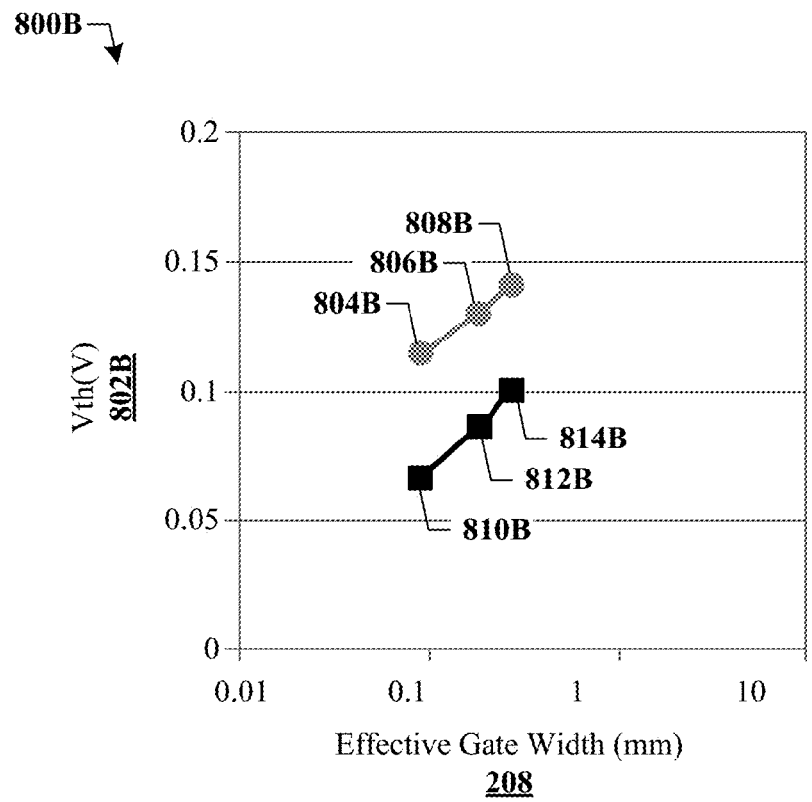

In some embodiments, it has been observed that the divot depth 804A correlates to a degree of the inverse narrow width effect observed in the semiconductor device 200. FIG. 8B illustrates a graph of some embodiments of threshold voltage ($V_{th}$) 802B of the semiconductor device 200 as a function of the effective channel width. Data points 804B-808B represent a semiconductor device 200 with a divot depth 804A of about 5 nm. Data points 810B-814B represent a semiconductor device 200 with a divot depth 804A of about 15 nm.

For a semiconductor device 200 with a divot depth 804A of about 5 nm, an effective channel width of about 0.1 μm gives a $V_{th}$ 802B of about 0.11 V at data point 804B, an effective channel width of about 0.12 μm gives a $V_{th}$ 802B of about 0.13 V at data point 806B, and an effective channel width of about 0.13 μm gives a $V_{th}$ 802B of about 0.14 V at data point 808B. For a semiconductor device 200 with a divot depth 804A of about 15 nm, an effective channel width of about 0.1 μm gives a $V_{th}$ 802B of about 0.07 V at data point 810B, an effective channel width of about 0.12 μm gives a $V_{th}$ 802B of about 0.09 V at data point 812B, and an effective channel width of about 0.13 μm gives a $V_{th}$ 802B of about 0.1 V at data point 814B. Therefore, a divot depth 804A of about 15 nm gives a superior inverse narrow width effect than a divot depth 804A of about 5 nm for the semiconductor device 200. It is therefore appreciated from FIG. 8B that a "shallow divot" (i.e., less than about 10 nm) mitigates "narrow width effects," so that $V_{th}$ is less sensitive to the channel width.

The narrow width effect for a comparatively narrow semiconductor device is a phenomenon that causes the $V_{th}$ 802B to increase as the effective channel width of the semiconductor device 200 decreases. The narrow width effect results from additional pockets of charge within a depletion region of the semiconductor device 200 that are not under the gate structure 108 (e.g., within the channel 106), but are controlled by the gate structure 108. For semiconductor devices 200 that utilize isolation structures 104A, 104B (e.g., STI) to prevent leakage, the electric field produced by the gate structure 108 is enhanced at the isolation structure edge, resulting in an "inverse narrow width effect," where the $V_{th}$ 802B of a comparatively narrow semiconductor device decreases as the effective channel width decreases.

Figure 9:
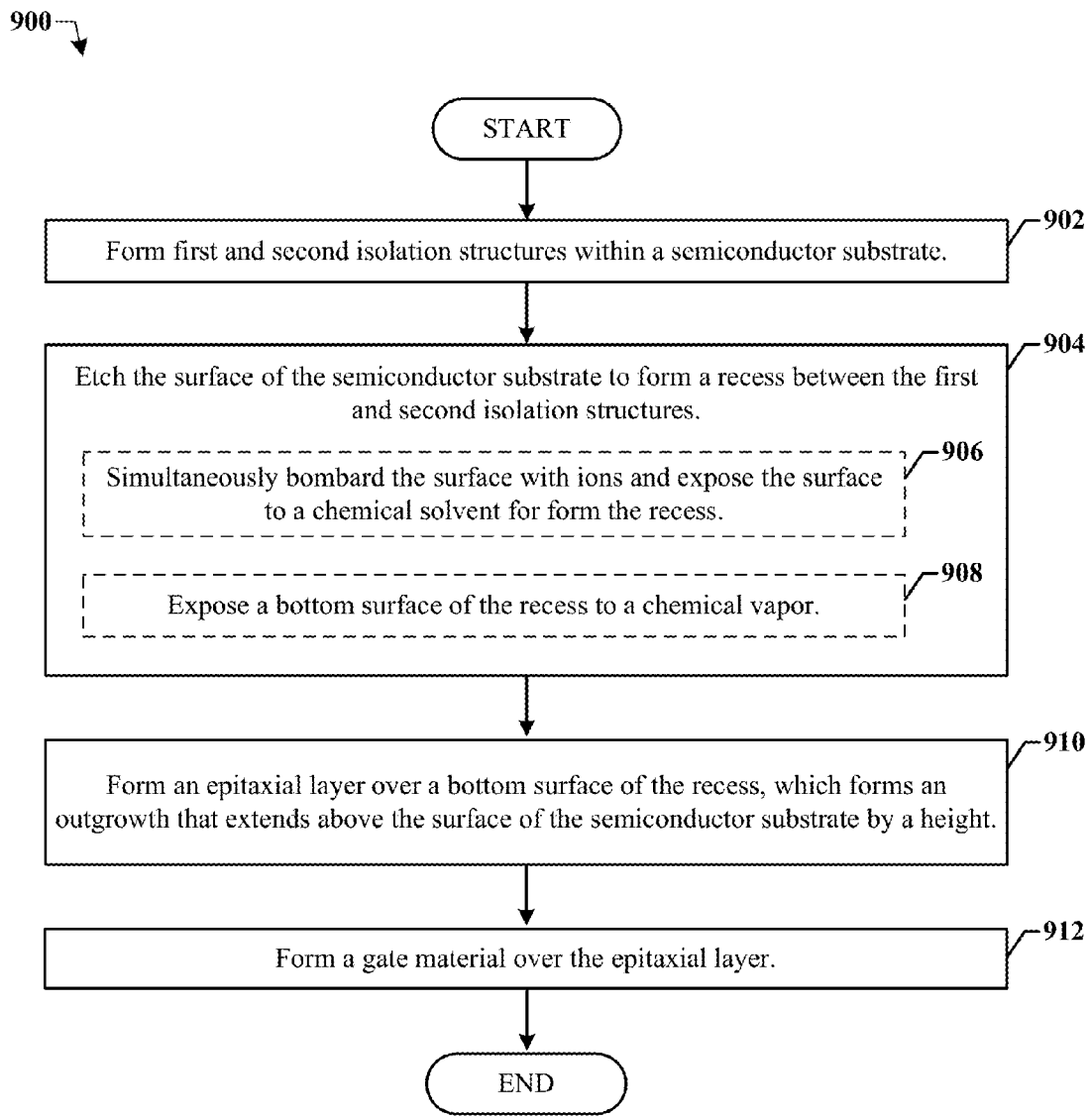
FIG. 9 illustrates some embodiments of a method for forming a semiconductor device.

FIG. 9 illustrates some embodiments of a method 900 for forming a semiconductor device. While the method 900 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902 first and second isolation structures are formed within a semiconductor substrate. Formation of the first and second isolation structures comprises an etch of the substrate to form first and second trenches, which are then filled with a dielectric material (e.g., SiO$_2$).

At 904 the surface of the semiconductor substrate is etched to form a recess between the first and second isolation structures. In some embodiments, the etch comprises simultaneously bombarding the surface with ions and exposing the surface to a chemical solvent for form the recess at 906, then subsequently exposing a bottom surface of the recess to a chemical vapor at 908.

At 910 an epitaxial layer is formed over a bottom surface of the recess, which forms an outgrowth that extends above the surface of the semiconductor substrate by a height. In some embodiments, a strain-relaxing layer is formed on the bottom surface of the recess below the epitaxial layer to reduce lattice mismatch between the epitaxial layer and substrate. In some embodiments, a substrate material layer is formed over the epitaxial layer and below the gate material.

At 912 gate material is formed over the epitaxial layer. The gate material forms a gate with an effective channel width that is about equal to a space between top surfaces of the first and second isolation structures plus twice the height of the outgrowth.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a semiconductor device configured to mitigate against parasitic coupling while maintaining threshold voltage control for comparatively narrow transistors. In some embodiments, a semiconductor device is formed on a semiconductor substrate. The semiconductor device comprises a channel comprising an epitaxial layer that forms an outgrowth above the surface of the semiconductor substrate, and a gate material formed over the epitaxial layer. In some embodiments, a method of forming a semiconductor device is disclosed. The method comprises etching the surface of a semiconductor substrate to form a recess between first and second isolation structures (e.g., STIs), forming an epitaxial layer within the recess that forms an outgrowth above the surface of the semiconductor substrate, and forming a gate material over the epitaxial layer.

In some embodiments, the present disclosure relates to a semiconductor device. The semiconductor device comprises a recess formed within a surface of a semiconductor substrate between first and second isolation structures. The semiconductor device comprises a channel comprising an epitaxial layer formed over a bottom surface of the recess, which forms an outgrowth that extends above the surface of the semiconductor substrate by a height. And, the semiconductor device comprises a gate material formed over the epitaxial layer.

In some embodiments, the present disclosure relates to a channel of a semiconductor device, comprising a substrate material layer and an epitaxial layer laterally formed below the substrate material layer and within a semiconductor substrate. In some embodiments, the epitaxial layer comprises silicon (Si) or other substrate material, a carbon-containing material such as silicon carbide (SiC), germanium-tin (GeSn), silicon-germanium (SiGe), or silicon-germanium-carbide (SiGeC), or combinations thereof. A gate structure is formed over a top surface of the layer of substrate material. In some embodiments, the layer of substrate material has a dopant concentration that is less than 1e18 cm$^{-3}$ at an interface between substrate material layer and the gate structure.

In some embodiments, the present disclosure relates to a method. The method comprises forming first and second isolation structures within a semiconductor substrate. The method comprises etching the surface of the semiconductor substrate to form a recess between the first and second isolation structures. The method comprises forming an epitaxial layer over a bottom surface of the recess, which forms an outgrowth that extends above the surface of the semiconductor substrate by a height. And, the method comprises forming a gate material over the epitaxial layer.

What is claimed is:

1. A semiconductor device, comprising:
    a recess formed within a surface of a semiconductor substrate between first and second isolation structures;
    a channel comprising an epitaxial layer formed over a bottom surface of the recess, wherein the epitaxial layer forms an outgrowth that extends above the surface of the semiconductor substrate by a height;
    a gate material formed over the epitaxial layer; and
    a divot formed in an upper portion of the first or second isolation structure at an interface to the channel near a to surface of the first or second isolation structure, wherein the divot is filled with gate material.

2. A semiconductor device, comprising:
    a semiconductor substrate;
    a first isolation structure that extends downwardly into an upper surface of the semiconductor substrate, wherein the first isolation structure has a first upper surface that extends above the upper surface of the semiconductor substrate by a first distance;
    an epitaxial layer that contacts an angled sidewall of an upper portion of the first isolation structure, wherein the epitaxial layer has an upper epitaxial surface that extends above the upper surface of the semiconductor substrate by a second distance that is greater than the first distance;
    a first gate structure disposed over the epitaxial layer; and
    a second gate structure disposed over the first isolation structure, wherein the epitaxial layer contacts a sidewall of the second gate structure.

3. A semiconductor device, comprising:
    a recess formed within a surface of a semiconductor substrate between first and second isolation structures;
    a channel region comprising an epitaxial layer formed over a bottom surface of the recess, wherein the epitaxial layer forms an outgrowth that extends above the surface of the semiconductor substrate by a height;
    a first gate structure formed over the epitaxial layer; and
    a second gate structure formed over the first or second isolation structure, wherein the second gate structure is taller than the first gate structure by a difference that is about equal to the height of the outgrowth.

4. The semiconductor device of claim 1, wherein an effective channel width of the semiconductor device is about equal to a width of the channel between top surfaces of the first and second isolation structures plus twice the height of the outgrowth.

5. The semiconductor device of claim 1, wherein the divot has a depth of less than about 10 nm.

6. The semiconductor device of claim 1, wherein the channel further comprises silicon (Si) formed over the epitaxial layer.

7. The semiconductor device of claim 1, further comprising a strain-relaxing layer formed on the bottom surface of the recess below the epitaxial layer.

8. The semiconductor device of claim 7, wherein the strain-relaxing layer comprises germanium (Ge) or silicon (Si).

9. The semiconductor device of claim 1, wherein the epitaxial layer comprises silicon (Si) or other substrate material, silicon carbide (SiC), germanium-tin (GeSn), silicon-germanium (SiGe), or silicon-germanium-carbide (SiGeC), or combinations thereof.

10. The semiconductor device of claim 1, wherein the height of the outgrowth is in a range of about 2 nm to about 10 nm.

11. The semiconductor device of claim 1, wherein the epitaxial layer has a dopant concentration that is less than 1e18 $cm^{-3}$ at an interface between the epitaxial layer and the gate material.

12. The semiconductor device of claim 2, wherein the epitaxial layer is disposed directly on the upper surface of the semiconductor substrate.

13. The semiconductor device of claim 2, further comprising a second isolation structure that extends downwardly into the upper surface of the semiconductor substrate and is spaced apart from the first isolation structure by a width, wherein the second isolation structure has a second upper surface that extends above the upper surface of the semiconductor substrate by the first distance.

14. The semiconductor device of claim 13, wherein the epitaxial layer comprises:
    a first epitaxial layer disposed over the upper surface of the semiconductor substrate; and
    a second epitaxial layer disposed over the first epitaxial layer and made of a different material than the first epitaxial layer.

15. The semiconductor device of claim 14, further comprising:
    a strain-relaxing layer disposed directly on the upper surface of the semiconductor substrate, below the first epitaxial layer, and between the first and second isolation structures.

16. The semiconductor device of claim 15:
    wherein the first epitaxial layer comprises silicon-carbide, germanium tin, silicon-germanium, silicon germanium carbide, or combinations thereof; and
    wherein the second epitaxial layer is made of the same material as the semiconductor substrate.

17. The semiconductor device of claim 16, wherein the semiconductor substrate and second epitaxial layer are made of silicon.

18. The semiconductor device of claim 13, further comprising:
    a strain-relaxing layer disposed on the upper surface of the semiconductor substrate, below the epitaxial layer, and between the first and second isolation structures.

19. The semiconductor device of claim 13, further comprising a third gate structure disposed over the second isolation structure, wherein the epitaxial layer contacts a sidewall of the third gate structure.

20. The semiconductor device of claim 19, wherein a portion of the epitaxial layer contacts the first upper surface of the first isolation structure and the second upper surface of the second isolation structure.

* * * * *